(12) United States Patent
Misewich et al.

(10) Patent No.: US 6,350,622 B2
(45) Date of Patent: Feb. 26, 2002

(54) PROCESS FOR FABRICATION OF AN ALL-EPITAXIAL-OXIDE TRANSISTOR

(75) Inventors: James A. Misewich, Peakskill; Alejandro G. Schrott, New York, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/768,172

(22) Filed: Jan. 24, 2001

Related U.S. Application Data

(62) Division of application No. 09/306,635, filed on May 7, 1999.

(51) Int. Cl.[7] .......................... H01L 21/00; H01L 21/16
(52) U.S. Cl. ............................. 438/2; 438/3; 438/104
(58) Field of Search ......................... 438/2, 3, 104, 438/17, 127

(56) References Cited

U.S. PATENT DOCUMENTS

| | | | | |
|---|---|---|---|---|
| 3,783,505 A | * | 1/1974 | Schoen, Jr. | 29/609 |
| 4,395,583 A | * | 7/1983 | Meulenberg, Jr. | 136/256 |
| 5,418,389 A | * | 5/1995 | Watanabe | 257/295 |
| 6,121,642 A | * | 9/2000 | Newns | 257/192 |

* cited by examiner

*Primary Examiner*—John F. Niebling
(74) *Attorney, Agent, or Firm*—McGinn & Gibb, PLLC; Marian Underweiser, Esq.

(57) ABSTRACT

A method and structure of forming an integrated circuit chip having a transistor includes forming a conductive oxide layer, forming a Mott transition oxide layer over the conductive oxide layer and forming an insulative oxide layer over the Mott transition oxide layer.

15 Claims, 4 Drawing Sheets

PROCESS FOR FABRICATION OF AN ALL-EPITAXIAL-OXIDE TRANSISTOR

CROSS-REFERENCE TO RELATED APPLICATION

This application is a division of U.S. application Ser. No. 09/306,635 filed May 7, 1999.

BACKGROUND OF THE INVENTION

1. Field of the Invention

The present invention generally relates to integrated circuit devices and more particularly to transistors formed exclusively from epitaxial oxide layers.

2. Description of the Related Art

Silicon based metal oxide semiconductor field effect transistors (MOSFETs) are reaching the limits of scaling (e.g., reduction in size) due to, among other things, doping and double depletion effects. In other words, as semiconductor devices are reduced in size, the depletion regions are placed in closer proximity to one another. This often results in merging or shorting of the adjacent depletion regions.

Silicon MOSFET technology is expected to scale to 0.1 micron channel length devices after the year 2000. Below 0.1 microns however, there are fundamental physical effects which can limit silicon MOSFET technology, including: short channel effects, dopant number fluctuations, and ballistic transport and tunneling through thin gate oxides. These effects may limit the minimum channel length in silicon MOSFET technology to an estimated 30 nm.

One solution to the scaling problem is a field effect transistor (FET) formed with a channel oxide capable of undergoing a metal-insulator transition known as a Mott transition (e.g., a Mott FET or MTFET).

A Mott FET is a solid state switching device made of oxide materials and is discussed in more detail in *Mott Transition Field Effect Transistor*, Applied Physics Letters, Vol. 73, Number 6, pages 780–782, Aug. 10, 1998, incorporated herein by reference. The Mott FET device includes a channel connecting source and drain electrodes, a gate oxide and a gate electrode.

For example, a Mott FET device is shown in FIG. 11. The device includes a conductive substrate 110 (e.g., Nb-STO (100)-cut crystal) which forms the gate electrode, a gate oxide layer 111 (e.g., strontium titanate (STO)) epitaxially grown on the substrate 110, a Mott conductor-insulator transition channel 112 (e.g., epitaxially grown cuprate material such as $Y_{1-x}Pr_xBa_2Cu_3O_{7-\delta}$ (YPBCO, LCO)), source and drain electrodes 113 and an isolation trench 114. With the structure shown in FIG. 11, when an electric field is applied to the gate 111, the channel 112 changes from an insulator to a conductor (or vice versa) to make or break a connection between the source and drain 113.

The Mott FET device is quite distinct from conventional silicon metal oxide field effect transistors in that the channel is a Mott insulator, a material with a characteristic, controllable, conductor-insulator transition, used in place of a semiconductor. A Mott FET device offers significant potential for scaling to the nanometer dimensions for integration with ferroelectric materials in non-volatile storage roles and for fabrication of multilayer device structures. Mott FET devices remain adequate on a nanoscopic scale which is well beyond the current projected limits of silicon MOSFET scaling.

However, the Mott FET discussed above has a number of limitations. Specifically, the structure shown in FIG. 11 results in the channel layer 112 being exposed to subsequent processing steps, which may damage or undesirably change the channel layer 112.

SUMMARY OF THE INVENTION

It is, therefore, an object of the present invention to provide a method for forming an integrated circuit chip having a transistor including forming a conductive oxide layer, forming a Mott transition oxide layer over the conductive oxide layer and forming an insulative oxide layer over the Mott transition oxide layer. Source and drain contacts are connected to the conductive oxide layer and a gate conductor is connected to the insulative oxide layer. The Mott transition oxide layer includes a channel region adjacent the gate conductor. The gate conductor contact connects to the same wiring level as the source and drain contacts. A release layer is formed on a substrate and the conductive oxide layer is formed on the release layer. The method further includes forming a flexible substrate over the insulative oxide layer and removing the substrate and the release layer. The Mott transition layer is a perovskite oxide. The forming of the conductive oxide layer, the Mott transition oxide layer, and the insulative oxide layer are performed using epitaxial growth processes.

Another embodiment of the invention is a method of forming a transistor and includes forming a strontium ruthanate layer, forming a perovskite oxide layer over the strontium ruthanate layer and forming a strontium titanate layer over the perovskite oxide layer. Source and drain contacts are formed connected to the strontium ruthanate layer and a gate conductor is connected to the strontium titanate layer. The perovskite oxide layer includes a channel region adjacent the gate conductor. The gate conductor contact connects to a same wiring level as the source and drain contacts. A release layer is formed on a substrate and the strontium ruthanate layer is formed on the release layer. A flexible substrate is formed over the strontium titanate layer and the substrate and the release layer are removed. The forming of the strontium ruthanate layer, the forming of the perovskite oxide layer and the forming of the strontium titanate layer are performed using epitaxial growth processes.

The invention also comprises an integrated circuit chip having a transistor that includes a conductive oxide layer, a Mott transition oxide layer over the conductive oxide layer and an insulative oxide layer over the Mott transition oxide layer. The integrated circuit chip includes source and drain contacts connected to the conductive oxide layer and a gate conductor connected to the insulative oxide layer. The Mott transition oxide layer includes a channel region adjacent the gate conductor. A gate conductor contact connects to a same wiring level as the source and drain contacts. The integrated circuit chip includes a release layer below the conductive oxide layer and a substrate below the release layer. The integrated circuit chip includes a flexible substrate over the insulative oxide layer. The Mott transition layer includes a perovskite oxide. The conductive oxide layer, the Mott transition oxide layer and the insulative oxide layer include epitaxially grown layers.

Therefore, the invention avoids the conventional problems associated with semiconductor structures. More specifically, with the invention, the size of the structures can be dramatically reduced because there are no diffusion regions and the size limitations imposed by doping restrictions and undesirable overlapping diffusion regions are avoided.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

The invention overcomes the foregoing problem of fabricating a Mott-FET device and allows the use of state of the art lithographic techniques, while preserving ideal conditions for epitaxial growth. The invention forms a Mott transition channel layer structure using a special process that provides the necessary contacts to the gate, source and drain regions and allows the use of any form of substrate, such as a flexible substrate.

Figure 1:
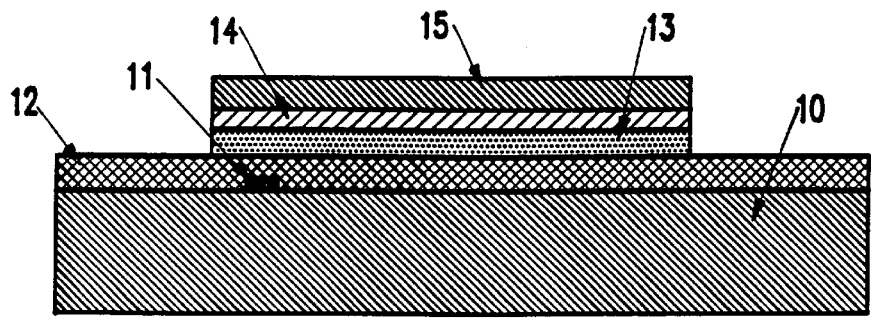
FIG. 1 is a schematic diagram of a partially completed integrated circuit structure according to the invention.

Referring now to FIG. 1, a thin (10–300 nm) alignment material 11, such as Pt is deposited (either by evaporation, sputtering, or other well known deposition process) and patterned (e.g., using common patterning techniques, such as lithographic masking and etching) to form at least one alignment mark 11 on a substrate 10, such as a clean, flat single crystal perovskite oxide substrate (e.g., Strontium titanate (STO)). Once the contact 11 has been formed, the substrate 10 is thoroughly cleaned to promote epitaxial growth on the substrate 10.

One ordinarily skilled in the art would understand that many different cleaning agents and processes could be used. For example, the sample could be ultrasound-cleaned in acetone, isopropanol, and ethanol, in successive stages. This could be followed by an $O_2$ ash (typically 1 min. at 50 Watts). The cleaned substrate (with the alignment mark 11) is then introduced into a deposition chamber for the formation of the succeeding layers 12–15.

Layers 12–15 can be epitaxially grown using any number of well-known processes, such as Pulsed Laser Deposition (PLD). First, a release layer 12, such as 10–50 nm of $YBa_2Cu_3O_7$, and a conductive oxide 13, such as strontium ruthanate, are formed over the substrate 10. A Mott-insulator oxide (channel) layer 14, and a gate insulator 15 (an oxide of high dielectric constant, such as Strontium Titanate or Barium Strontium Titanate) are then formed.

In a preferred embodiment, perovskite oxide is used for the channel layer 14. While one ordinarily skilled in the art would know (in light of this disclosure) of many perovskite oxides which may be utilized, in a preferred embodiment, materials such as $La_2CuO_4$ or $Y_{1-x}Pr_xBa_2Cu_3O_7$ (where x<1) are used for p-type channels and $Nd_2CuO_4$ is used for n-type channels. The thickness of the channel can be any thickness required by the given design and preferably is about 30–10 nm.

The natural conductivity of the channel layer 14 can be modified by changing its oxygen content. This is accomplished by annealing the sample in either an oxygen atmosphere, for an oxygen increase, or in a noble gas (or vacuum) atmosphere for an oxygen decrease. A p-type Mott transition channel layer which has a low oxygen content (e.g., a p-type accumulation device) will have a low number of carriers (e.g., holes) and will naturally be an insulator. The low oxygen channel layer becomes a conductor when it is adjacent a negative voltage source (e.g., voltage is supplied to the gate). In a complementary arrangement, a p-type Mott transition channel layer 14 having a high oxygen content (e.g., a p-type depletion device) will have a high number of carriers and will be a conductor (absent an electrical charge in the gate). Similarly, when a positive voltage is applied to the gate, the high oxygen content channel layer 14 will become an insulator.

An n-type Mott transition channel layer 14 (e.g., an n-type accumulation device) which has a high oxygen content will have a low number of carriers (electrons) and will be an insulator. The high oxygen channel layer 14 becomes a conductor when a positive voltage is supplied to the gate. In a complementary arrangement, a n-type Mott transition channel layer 14 having a low oxygen content (e.g., an n-type depletion device) will have a high number of carriers and will be a conductor (absent an electrical charge in the gate). Similarly, when a negative voltage is applied to the gate, the low oxygen content channel layer 14 will become an insulator.

Figure 2:
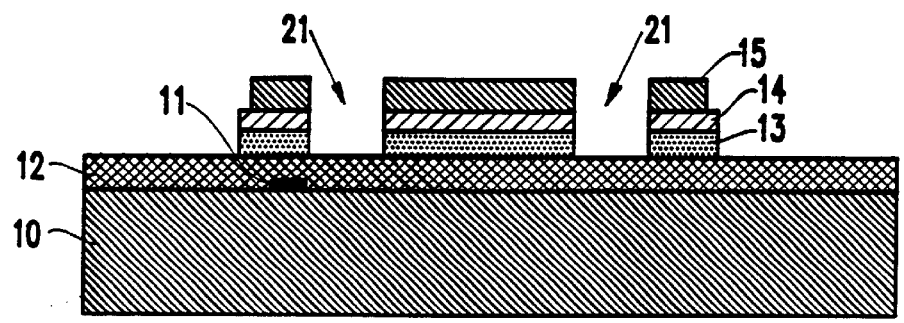
FIG. 2 is a schematic diagram of a partially completed integrated circuit structure according to the invention.
Figure 3:
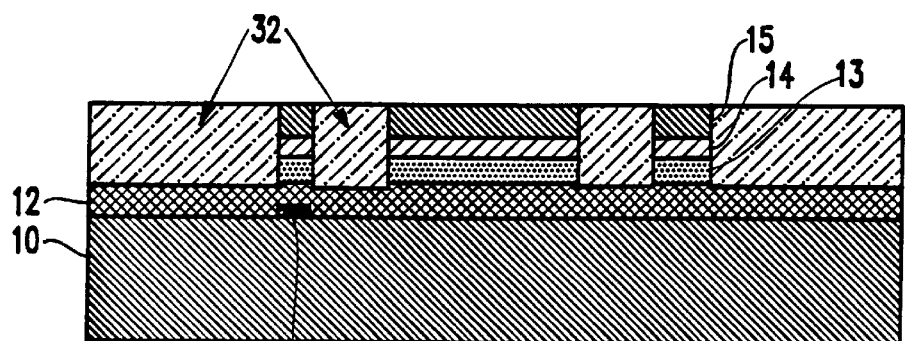
FIG. 3 is a schematic diagram of a partially completed integrated circuit structure according to the invention.

In FIG. 2, trenches 21 are formed using conventional etching techniques, such as reactive ion etching (RIE), ion beam milling or chemical etching, through a lithographic mask. The trenches are then filled (through the mask or by a damascene process) with an insulating layer 32 (e.g., preferably a low dielectric constant material such as tetraethylorthosilicate (TEOS)), as shown in FIG. 3. This is followed by opening vias 43, as shown in FIG. 4 using conventional masking and etching techniques, such as those discussed above.

Figure 4:
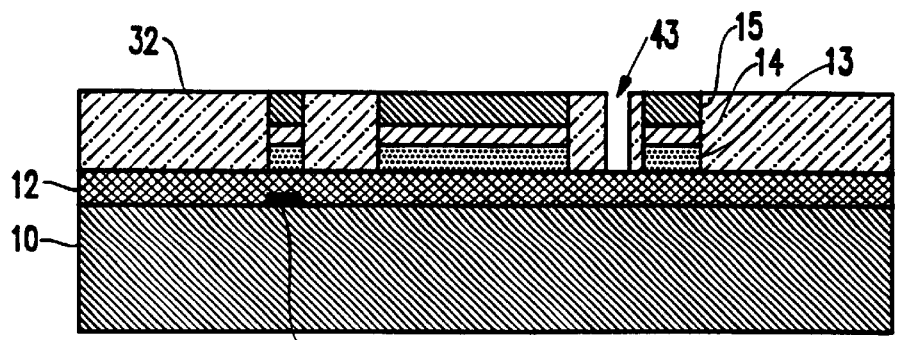
FIG. 4 is a schematic diagram of a partially completed integrated circuit structure according to the invention.
Figure 5:
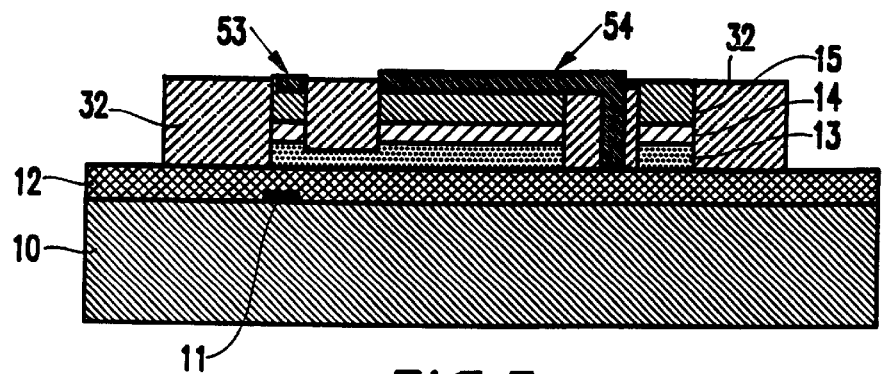
FIG. 5 is a schematic diagram of a partially completed integrated circuit structure according to the invention.

As shown in FIG. 5, a conductive layer, such as a metal, alloy or polysilicon, is deposited over the structure filling the opening 43 formed in FIG. 4. The conductive layer is then patterned using conventional lithographic patterning and etching techniques to form a gate electrode 54 and an alignment mark 53.

Figure 6:
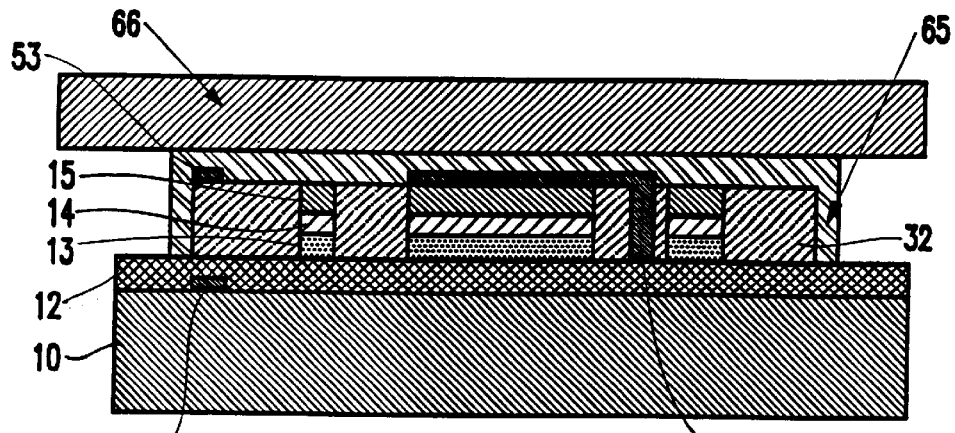
FIG. 6 is a schematic diagram of a partially completed integrated circuit structure according to the invention.

A polymer 65, such as Benzo Cyclo Butene (BCB), or a wax is then deposited over the structure as shown in FIG. 6. A suitable "top-substrate" 66, such as a rigid or flexible substrate, is then attached to the structure using any common thermally or chemically reactive adhesive.

Figure 7:
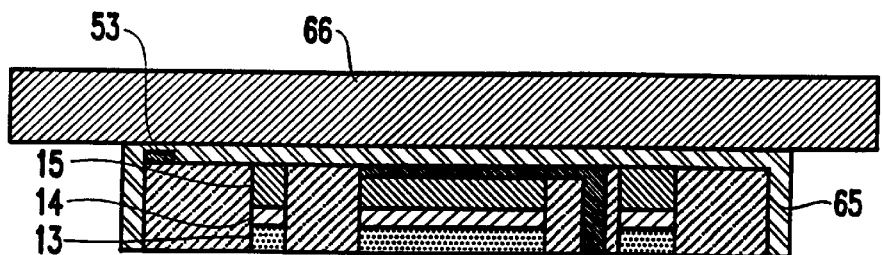
FIG. 7 is a schematic diagram of a partially completed integrated circuit structure according to the invention.

The release layer 12 and substrate 10 are then removed from the structure, as shown in FIG. 7, using, for example, a selective etching solution such as a diluted solution of HCl or another acid which dissolves the release layer 12 but does not affect the oxide material 13.

Figure 8:
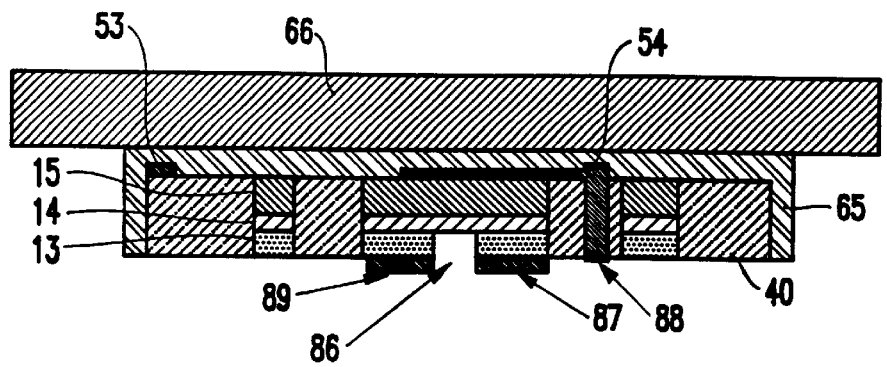
FIG. 8 is a schematic diagram of a completed integrated circuit structure according to the invention.

The completed device is shown in FIG. 8. A channel 86 is defined by removing, by reactive ion etching or ion milling through a mask, a section of the epitaxial electrode layer 13. Then, a conductive material (such as those mentioned above) is formed and patterned to form source 87 and drain 89 electrodes and to possibly enhance the gate electrode 54 as shown in item 88.

In operation, the structure shown in FIG. 8 performs as any conventional transistor would perform. As mentioned above, the Mott-transition layer 14 is either naturally conductive or naturally non-conductive depending upon its oxygen content. Therefore, if the Mott-transition layer 14 is naturally non-conductive an electrical connection can be made between the source 87 and the drain 89 by applying a voltage to the gate 54. More specifically, voltage in the gate 54 causes the Mott-transition layer 14 to become conductive in the channel region 86. Therefore, applying voltage to the gate 54 allows current to flow between the source 87 and the drain 89. Similarly, a Mott-transition layer 14 which is naturally conductive will become non-conductive upon application of voltage to the gate electrode 54.

Therefore, the inventive structure acts as any conventional transistor. However, since no doping is required and no diffusion regions are formed, the conventional problems associated with semiconductor structures are avoided. More specifically, with the invention, the size of the structures can be dramatically reduced because there are no diffusion regions and the size limitations caused by the doping of the diffusion regions and the occurrence of overlapping diffusion regions are avoided.

Figure 9:
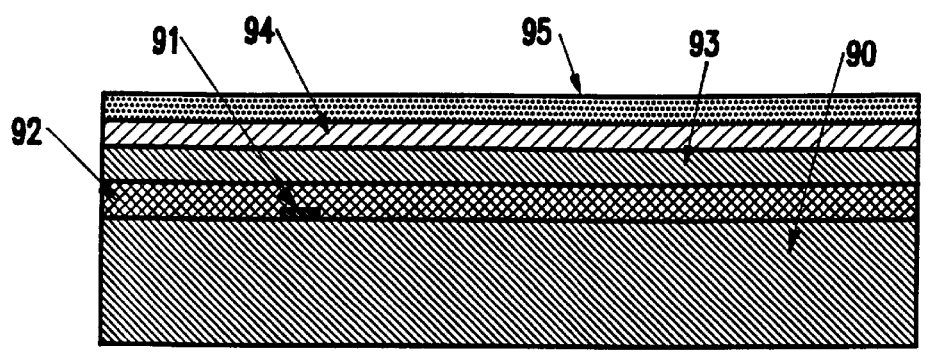
FIG. 9 is a schematic diagram of a partially completed integrated circuit structure according to the invention.
Figure 10:
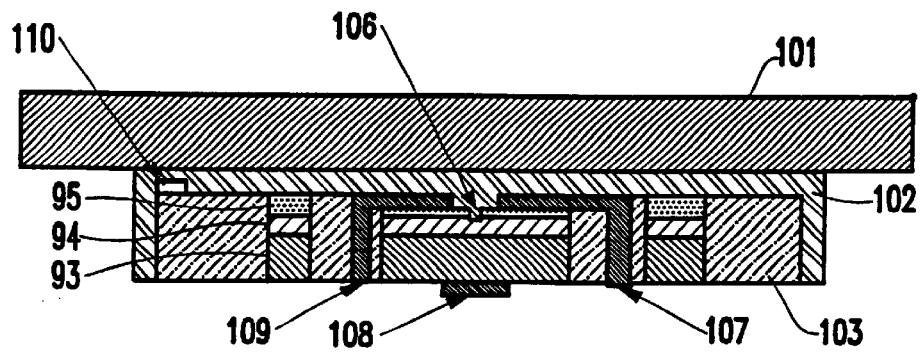
FIG. 10 is a schematic diagram of a completed integrated circuit structure according to the invention.
Figure 11:
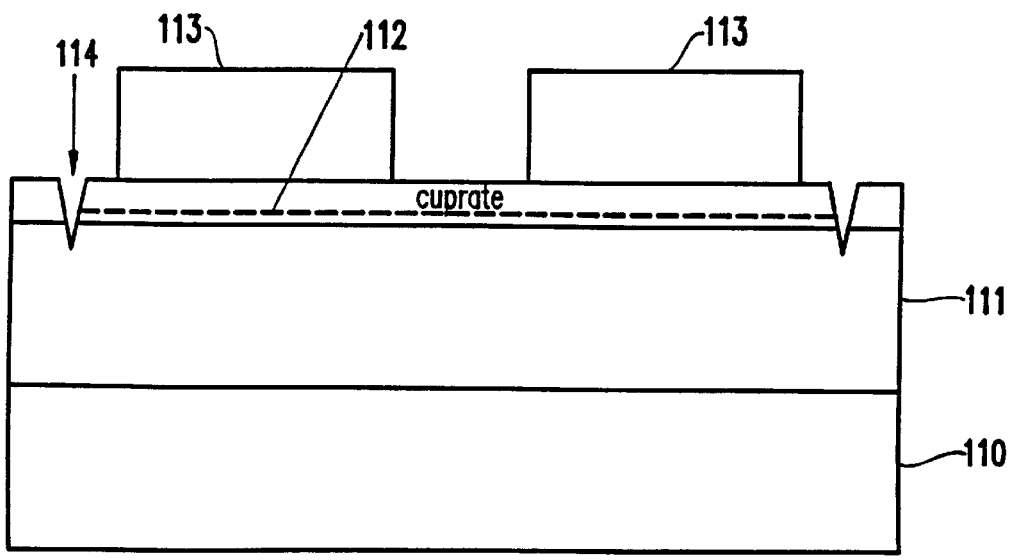
FIG. 11 is a schematic diagram of an integrated circuit structure.

A second embodiment is shown in FIGS. 9 and 10. The second embodiment is similar to the first in that layers 92–95 are epitaxially grown over a substrate 90 having at least one alignment mark 91; however, the order of the layers 93–95 is changed and the connections to the source, drain and contact are reversed.

More specifically, a release layer 92, similar to that discussed above, is formed over the substrate 90 and alignment mark 91. An epitaxial gate oxide layer 93 similar to that discussed above is deposited immediately after the release layer 92. This is followed by an epitaxial Mott-transition channel-layer 94 and an epitaxial electrode layer 95.

As shown in FIG. 10, a channel region 106 is formed by etching a portion of the conductive oxide 95, using conventional masking and etching techniques. The etching process which forms the channel region 106 may also reduce the thickness of the conductive oxide 95 to accommodate for source and drain contacts 107, 109. Formation of openings, conductive material deposition, and patterning is carried out as explained above with respect to the gate electrode 54 to form the source and drain contacts 107, 109. The alignment mark 110 is also formed at this time in a similar manner to the alignment mark 53.

An insulating layer 103 is formed as the insulating layer 32 was formed above. Further, an isolation region 102 and "top-substrate" 101 are formed as discussed above with respect to isolation region 65 and top-substrate 66. The substrate 90 and detachment layer 92 are detached as discussed above. A gate electrode 108 is then formed in a similar manner as source and drain regions 87, 89 were formed above to complete the structure.

Figure 12:
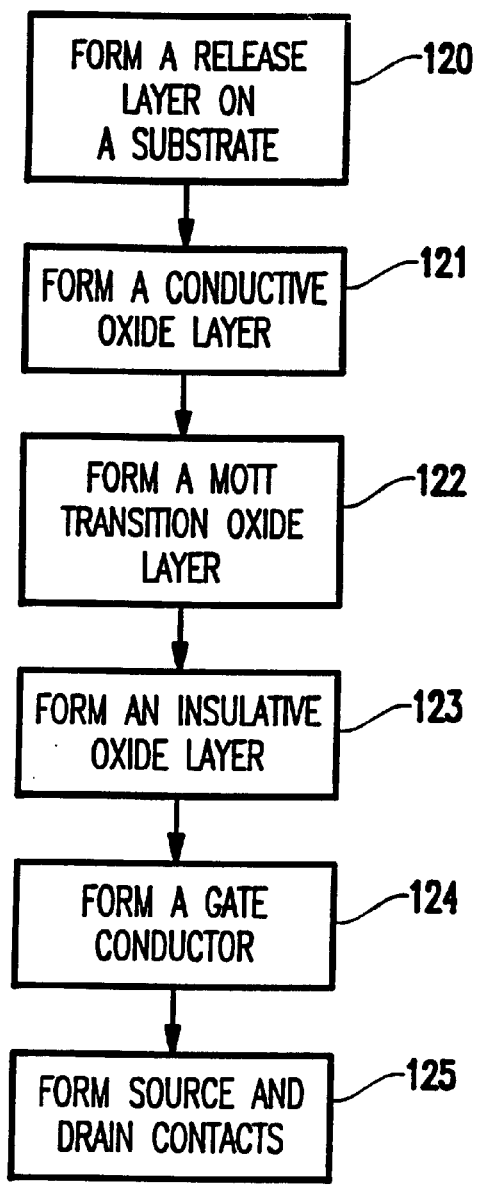
FIG. 12 is a flow diagram illustrating a preferred method of the invention.

FIG. 12 is a flowchart representation of the first embodiment of the invention. More specifically, in FIG. 12, the release layer 12 is formed on the substrate 10 as shown in item 120. In item 121 the conductive oxide layer 13 is epitaxially formed. The Mott transition oxide layer 14 is epitaxially formed in item 122. In item 123 the insulative oxide layer 15 is epitaxially formed. The gate conductor 54 is then formed in item 124 and source and drain contacts 87, 89 are formed in item 125.

Figure 13:
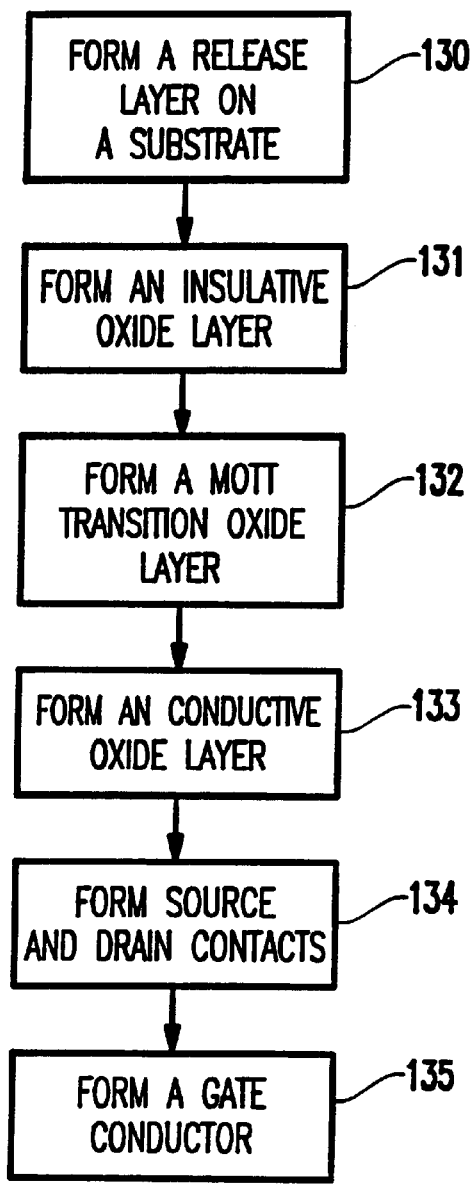
FIG. 13 is a flow diagram illustrating a preferred method of the invention.

In FIG. 13 the release layer 92 is formed on the substrate 90 in item 130. In item 131 the insulative oxide layer 93 is epitaxially formed. The Mott transition oxide layer 94 is epitaxially formed in item 132. The conductive oxide layer 95 is epitaxially formed in item 133. The source and drain contacts 107, 109 are formed in item 134 and the gate conductor 108 is formed in item 135.

As discussed above, as conventional doped semiconductor devices are reduced in size, the depletion regions are placed in closer proximity to one another. This often results in merging or shorting of the adjacent depletion regions. However, with the invention, no doping is required and no diffusion regions are formed. Therefore, the invention avoids the conventional problems associated with semiconductor structures. More specifically, with the invention, the size of the structures can be dramatically reduced because there are no diffusion regions and the size limitations imposed by doping restrictions and undesirable overlapping diffusion regions are avoided.

Further, the invention forms the gate insulator 15, 93, channel region 14, 94 and the electrode layer 13, 95 as a laminated epitaxially grown oxide structure. Such a structure will minimize the defect density at the channel gate oxide interface, allowing the scalability of the devices to become closer to the theoretical limit (nanoscopic scale).

In addition, the use of the release layer/substrate 10, 12 and 90, 92 permits the gate contact 54, 108 and the source and drain 87, 89 and 107, 109 to be commonly located on one side of the transistor to allow the designer more wiring options and to simplify the wiring structure. Further, the release layer/substrate 10, 12 and 90, 92 permits the use of any type of top substrate 66, 101 such as a flexible substrate, thereby expanding the applicability of the Mott transition field effect transistor. In addition, the invention allows the designer to fabricate the contacts in a very small scale, with a minimum introduction of defects.

While the invention has been described in terms of preferred embodiments, those skilled in the art will recognize that the invention can be practiced with modification within the spirit and scope of the appended claims.

What is claimed is:

1. A method of forming an integrated circuit chip having a transistor, said method comprising:
   forming a conductive oxide layer;
   forming a Mott transition oxide layer over said conductive oxide layer; and
   forming an insulative oxide layer over said Mott transition oxide layer.

2. The method in claim 1, further comprising forming source and drain contacts connected to said conductive oxide layer and forming a gate conductor over said insulative oxide layer.

3. The method in claim 2, wherein said Mott transition oxide layer includes a channel region adjacent said gate conductor.

4. The method in claim 2, further comprising forming a gate conductor contact connected to a same wiring level as said source and drain contacts.

5. The method in claim 1, further comprising forming a release layer on a substrate, said conductive oxide layer being formed on said release layer.

6. The method in claim 5, further comprising forming a flexible substrate over said insulative oxide layer and removing said substrate and said release layer.

7. The method in claim 1, wherein said Mott transition layer comprises a perovskite oxide.

8. The method in claim 1, wherein said forming of said conductive oxide layer, said forming of said Mott transition oxide layer and said forming of said insulative oxide layer comprise epitaxial growth processes.

9. A method of forming a transistor comprising:

forming a strontium ruthanate layer;

forming a perovskite oxide layer over said strontium ruthanate layer; and forming an strontium titanate layer over said perovskite oxide layer.

10. The method in claim 9, further comprising forming source and drain contacts connected to said strontium ruthanate layer and forming a gate conductor over said strontium titanate layer.

11. The method in claim 10, wherein said perovskite oxide layer includes a channel region adjacent said gate conductor.

12. The method in claim 10, further comprising forming a gate conductor contact connected to a same wiring level as said source and drain contacts.

13. The method in claim 9, further comprising forming a release layer on a substrate, said strontium ruthanate layer being formed on said release layer.

14. The method in claim 13, further comprising forming a flexible substrate over said strontium titanate layer and removing said substrate and said release layer.

15. The method in claim 9, wherein said forming of said strontium ruthanate layer, said forming of said perovskite oxide layer and said forming of said strontium titanate layer comprise epitaxial growth processes.

* * * * *